(12) United States Patent
Neijzen et al.

(10) Patent No.: US 7,605,979 B2
(45) Date of Patent: Oct. 20, 2009

(54) DEVICE FOR DIRECTING RADIATION TO A LAYER, APPARATUS WITH SUCH DEVICE AND METHOD USING SUCH APPARATUS

(75) Inventors: Jacobus Hermanus Maria Neijzen, Eindhoven (NL); Helmar Van Santen, Amsterdam (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/911,559

(22) PCT Filed: Apr. 13, 2006

(86) PCT No.: PCT/IB2006/051149

§ 371 (c)(1),
(2), (4) Date: Oct. 15, 2007

(87) PCT Pub. No.: WO2006/111896

PCT Pub. Date: Oct. 26, 2006

(65) Prior Publication Data

US 2008/0186549 A1 Aug. 7, 2008

(30) Foreign Application Priority Data

Apr. 19, 2005 (EP) .................................. 05103140

(51) Int. Cl.
*G02B 27/10* (2006.01)
*G02B 27/14* (2006.01)
(52) U.S. Cl. ...................................... 359/618; 359/629
(58) Field of Classification Search ................. 359/618, 359/629
See application file for complete search history.

(56) References Cited

U.S. PATENT DOCUMENTS 5,085,509 A 2/1992 Gafford et al.

(Continued)

FOREIGN PATENT DOCUMENTS

DE 2624121 A1 12/1977

(Continued)

OTHER PUBLICATIONS

Written Opinion of the International Searching Authority for International Application No. PCT/UB2006/051149.

*Primary Examiner*—Jordan M. Schwartz
*Assistant Examiner*—James C Jones

(57) ABSTRACT

A device for directing radiation to a layer (1) is described. The device includes a first optical element (L1) for focusing a first radiation beam (B1) originating from a first radiation source (S1) onto said layer, a second optical element (L2) for focusing a second radiation beam (B2) originating from a second radiation source (S2) onto said layer. The wavelengths of the radiation from said first and said second radiation source are different from each other. The first and second optical element are jointly movable with respect to said radiation sources, wherein the focal points of the two radiation beams at least substantially coincide with various movements of the first optical element and the second optical element with respect to the radiation sources. The second optical element (L2) has an aperture (A2) which allows optically undisturbed passage of the first radiation beam (B1). In this way a compact and light configuration of L1 and L2 is achieved as well as an improved radiation beam quality. Further an apparatus comprising such a device and a method using such an apparatus are disclosed.

11 Claims, 3 Drawing Sheets

U.S. PATENT DOCUMENTS

Figure 1:
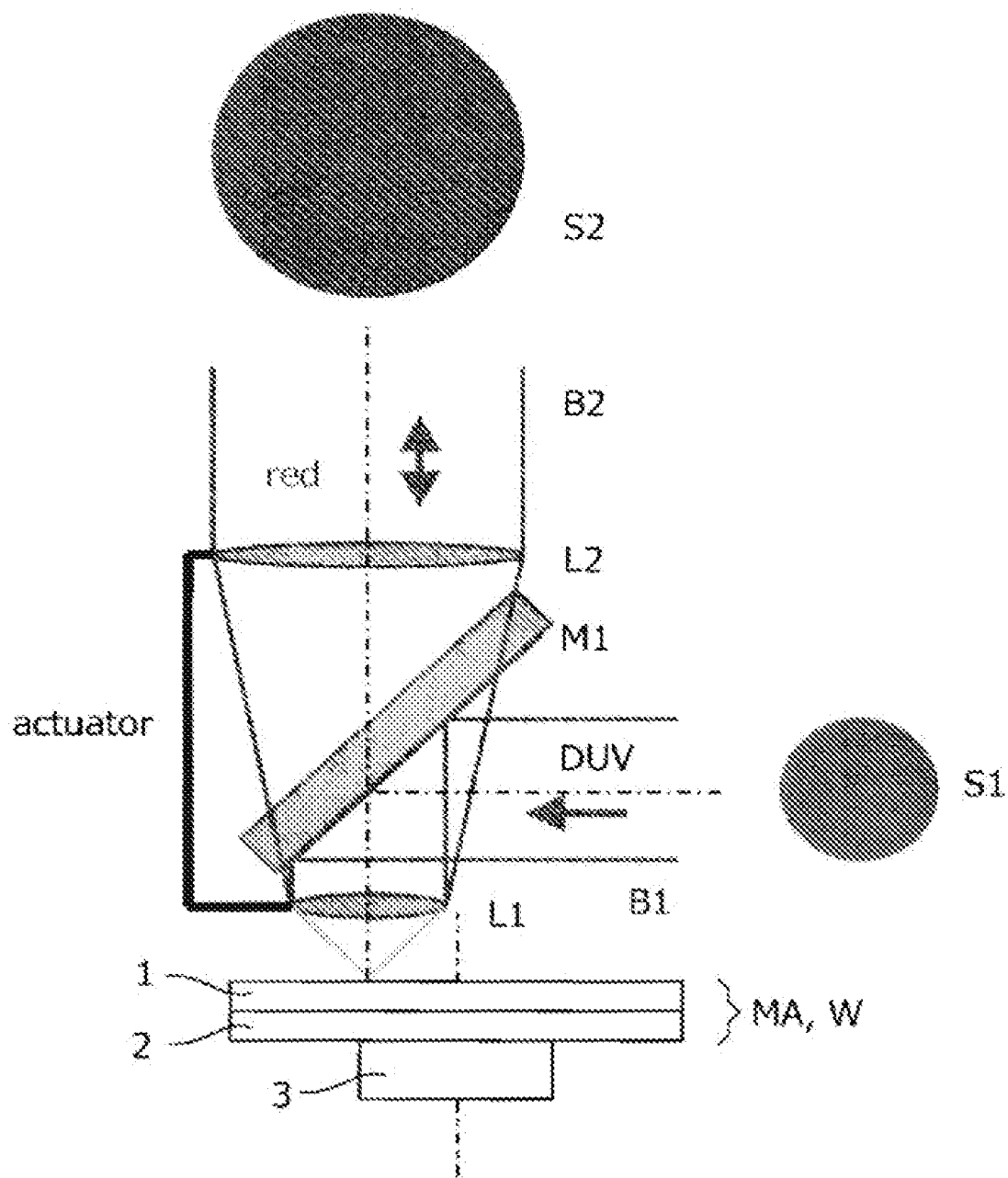

| | | | |
|---|---|---|---|
| 6,067,105 A | 5/2000 | Kim et al. | |
| 6,118,574 A | 9/2000 | Imanishi et al. | |
| 6,437,287 B1 | 8/2002 | Offerhaus et al. | |
| 6,501,723 B2 | 12/2002 | Stockx | |
| 6,791,057 B1 | 9/2004 | Kratzsch et al. | |
| 2002/0105894 A1 | 8/2002 | Stockx et al. | |
| 2003/0047542 A1 | 3/2003 | Ehlers et al. | |
| 2004/0155203 A1 | 8/2004 | Makimura | |
| 2008/0231928 A1* | 9/2008 | Stevens | 359/196 |

FOREIGN PATENT DOCUMENTS

| | | |
|---|---|---|
| EP | 0025594 | 3/1981 |
| EP | 772189 A2 | 5/1997 |
| EP | 1083556 A1 | 3/2001 |
| JP | 58043420 | 3/1983 |
| JP | 60047482 | 3/1985 |
| JP | 60216988 | 10/1985 |
| JP | 63273587 | 11/1988 |
| JP | 07022685 | 1/1995 |
| JP | 09155578 | 6/1997 |
| JP | 09288850 | 11/1997 |
| JP | 2000306274 | 11/2000 |
| JP | 2002008254 | 1/2002 |
| JP | 2003272187 | 9/2003 |
| WO | 9910881 | 3/1999 |

* cited by examiner

DEVICE FOR DIRECTING RADIATION TO A LAYER, APPARATUS WITH SUCH DEVICE AND METHOD USING SUCH APPARATUS

The invention relates to a device for directing radiation to a layer including:
a first optical element for focusing a first radiation beam originating from a first radiation source onto said layer,
a second optical element for focusing a second radiation beam originating from a second radiation source onto said layer, wherein the wavelengths of the radiation from said first and said second radiation source are different from each other, and
the first and second optical element being jointly movable with respect to said radiation sources, wherein the focal points of the two radiation beams at least substantially coincide with various movements of the first optical element and the second optical element with respect to the radiation sources.

The invention further relates to an apparatus comprising such a device.

The invention further relates to a method of manufacturing with such an apparatus.

The exposing of very fine structures on a layer, sensitive to radiation, requires the use of a short writing wavelength and a high NA (numerical aperture) objective lens.

An example of such equipment is a deep-ultraviolet laser beam recorder (LBR) mastering machine in which a deep-UV (DUV) laser beam is focused on e.g. a resist layer, which is situated on top of a rotating disc: a master plate. The term master plate is understood to mean a plate which can be used for making a mold, or stamper, that is used for manufacturing optical discs, e.g. CD's, DVD's, BD's and the like, by means of an injection molding process. It is also possible, however, to use the master plate itself as a mold. The term optical data storage medium as used in the present patent application refers to a master plate as well as to a CD, DVD, BD or the like, unless indicated otherwise. It is also possible to move a master plate linearly while being exposed (X, Y movement).

Another example is a lithographic machine using DUV radiation in order to expose e.g. a silicon wafer provided with a radiation sensitive layer, e.g. a resist. The wafer is e.g. moved linearly while being exposed (X, Y movement). It may also be possible to rotate the wafer while being exposed.

Focusing of the writing radiation beam on the moving resist surface is realized by actively actuating the objective lens, while monitoring the focus with a focus sensor. In the optical disc mastering process, it is advantageous to use a second different radiation beam, with a non-exposing wavelength for the focusing system as this allows remaining in focus when no data are written. Therefore, often a radiation beam with a relatively high wavelength, e.g. a red laser beam, is applied in the focusing system, whereas the resist is exposed by e.g. DUV radiation. The effective focal length of available objective lenses for this short wavelength, however, usually is considerably different for the focusing wavelength and the exposing wavelength. Therefore, for the red light of the focus sensor, the objective lens has to be complemented by an additional correction lens. This correction lens is required in the red light path only.

A device as described in the opening paragraph is known from U.S. Pat. No. 6,501,723. In U.S. Pat. No. 6,501,723 a confocal light path is made for both the red and DUV wavelength is by putting a dichroic mirror M1 between lens L1 and the correction lens L2 (see FIG. 1). By actuating the combination of L1 and L2, while M1 remains fixed, a perfect focus can be maintained for the exposing DUV laser beam using the red focus sensor. This construction, however, has several disadvantages.

The combination of two actuated lenses with a fixed mirror in between, leads to a relatively large and thereby heavy construction. This is quite a disadvantage, as the system must be actuated very fast and accurately.

The wave front distortions of the DUV beam should be kept to a minimum, resulting in an expensive and relatively thick mirror M1 with a special dichroic coating. The thickness of the oblique mirror leads to significant astigmatism in the red light path. Furthermore, for some applications the use of a separate red focus sensor is not necessary and the DUV light itself is used for focusing. Especially in these cases, it is a serious drawback to have additional optical elements such as dichroic mirrors in the critical DUV light path.

If a red focus sensor is used in combination with a liquid immersion DUV objective, the intensity of the red light reflected from the water/resist interface is relatively low. That leads to unfavorable interference with other weak reflections from the quartz/water interface of the final lens element and reflection from other interfaces in the DUV objective. The interference turns out to be dominant in the central, low NA, part of the red beam, close to the optical axis.

It is an object of the invention to provide a device of the kind as described in the opening paragraph, which solves one or more the mentioned disadvantages.

It is a further object of the invention to provide an apparatus comprising such a device.

It is still a further object of the invention to provide a method of manufacturing using such an apparatus.

The first object has been achieved in accordance with the invention by a device, which is characterized in that the second optical element has an aperture, which allows optically undisturbed passage of the first radiation beam. The aperture e.g. is a central hole. The first radiation beam is the most critical beam, e.g. a deep ultra violet (DUV) beam. Whether the second radiation beam, e.g. a beam of a red focus system, is used or not, the beam quality of the first radiation beam is not degraded by additional optical elements. Because no static dichroic mirror is required, the second optical element, lens L2, can be placed closer to the first L1 and therefore can be smaller, leading to a simpler and lighter construction for the actuated elements.

In an embodiment the intensity of the second radiation beam at the position of the aperture is substantially zero. E.g. an annular shape of the second radiation beam, e.g. the red focus beam, reduces the unfavorable interferences, which are most dominant in the region close to the optical axis. This annular shape may be achieved by a stop in the beam.

It is advantageous when the first radiation beam is aimed at the first optical element as a substantially parallel radiation beam, whilst the second radiation beam is aimed at the second optical element as a substantially parallel radiation beam. This allows movement of the device relative to the radiation sources without the need for optical adjustments.

In an embodiment the first optical element and said second optical element are mechanically interconnected. This has the advantage that the focal points of the two radiation beams will at least substantially coincide with various movements of the first optical element, e.g. objective, and the second optical element, e.g. correction lens, with respect to the radiation source. By means of the correction lens the radiation beam from the second radiation source is caused to converge or diverge relative to the first radiation beam in such a manner that the two radiation beams are focused at the same point after exiting the objective. By moving the objective jointly with the correction lens, the focal points of the two radiation beams will coincide in every position of the objective with respect to the radiation source.

In an advantageous embodiment a plate is disposed between the second optical element and the first radiation source, which plate has an aperture through which the first radiation beam passes optically undisturbed, whilst the second radiation beam is reflected, outside the aperture, by the plate in the direction of the second optical element. The plate, e.g. a mirror, has, e.g. a central hole, which allows undisturbed passage of the first radiation beam, which is the most critical beam, e.g. a DUV beam. Whether the second radiation beam, e.g. a red focus system, is used or not, the beam quality of the DUV beam is not degraded by additional optical elements. The plate is static and does not move together with the first and second optical elements. Furthermore the plate, e.g. mirror, is only used by the second radiation beam, e.g. red light, which reduces the demands for the coating and makes the plate thickness irrelevant. An annular beam of red focusing light is condensed in the objective with the appropriate convergence.

Preferably the plate includes an angle with the first radiation beam, e.g. 45 degrees. Preferably, at least one the radiation sources is a laser. Lasers are available cheaply and provide a beam of high optical quality.

The second object is achieved by an apparatus for exposing a master plate, which master plate is suitable for the manufacture of an optical data storage medium, the apparatus comprising:
  a support for said master plate, and
  a device according to the invention as described above, wherein the layer as described in the opening paragraph is a layer present on said master plate (MA).

Alternatively the object is achieved with an apparatus suitable for exposing a wafer, which wafer is suitable for the manufacture of an integrated circuit, the apparatus comprising:
  a support for said wafer, and
  a device according to the invention as described above, wherein the layer as described in the opening paragraph is a layer present on said wafer.

The third object is achieved by a providing a method of manufacturing an optical data storage medium comprising the steps of:
  exposing a master plate with an apparatus as described above,
  making a stamper on the basis of the master plate,
  using the stamper to manufacture the optical data storage medium.

Alternatively the third object is achieved by providing a method of manufacturing an integrated circuit comprising the steps of:
  a) on a wafer, exposing the wafer with an apparatus as described above,
  b) processing the wafer in order to remove parts of the layer and/or deposit a new layer,
  c) repeating steps a and b if required,
  d) cutting the wafer in order to isolate a usable integrated circuit.

Figure 2:
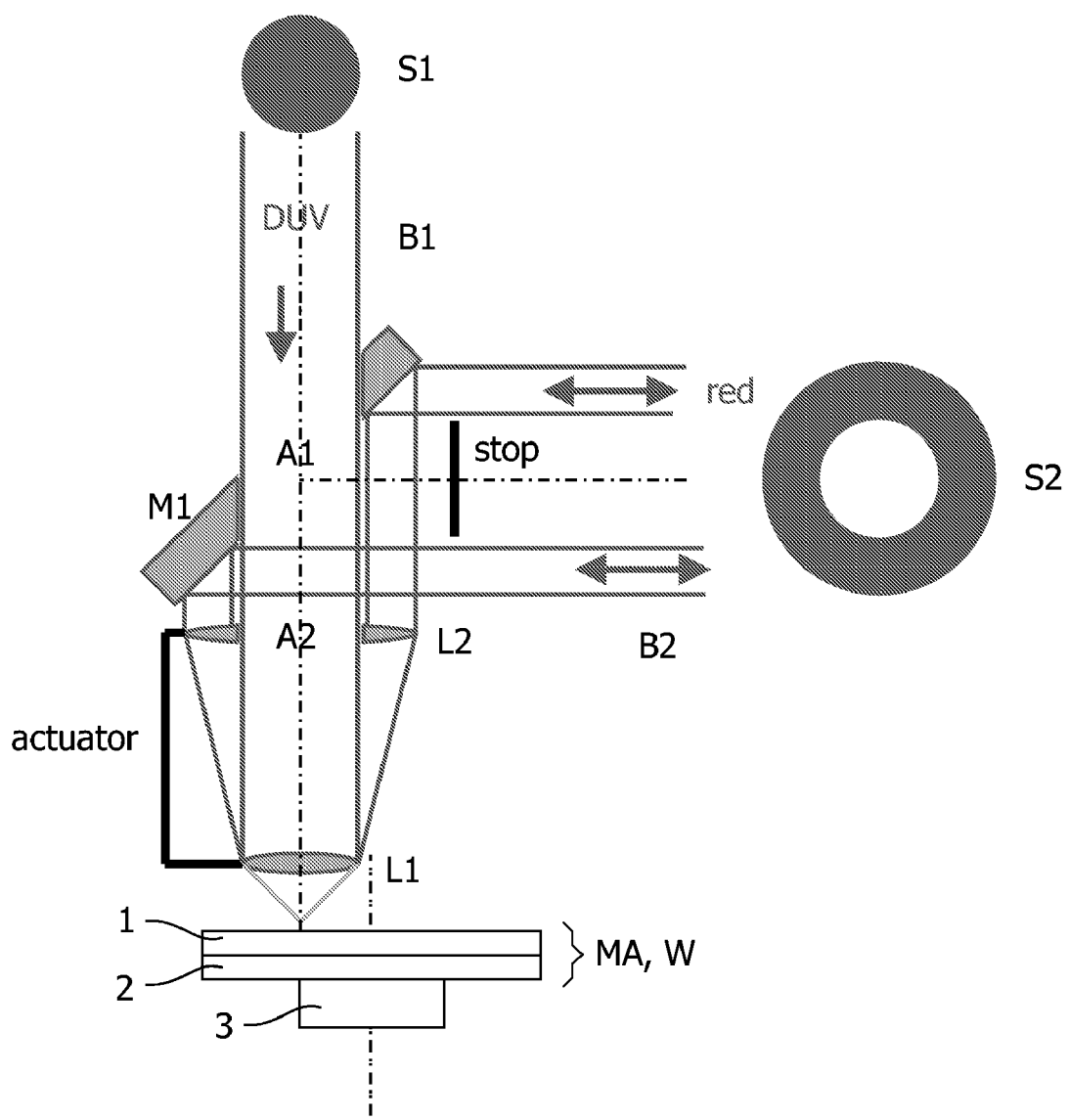
Figures 3A, 3B, 3C, 3D, 3E, 3F:
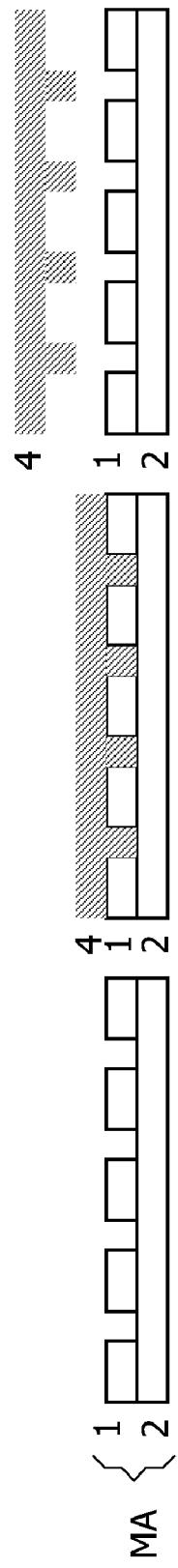

The invention will now be explained in more detail with reference to the drawings in which FIG. 1 shows a normal far-field optical recording objective exposing an optical disc master or a wafer, FIG. 2 shows a Near-Field optical recording objective according to the invention exposing an optical disc master or a wafer, FIGS. 3A to 3F show steps of a method of manufacturing an optical disc using a master plate exposed with the objective of FIG. 2.

In FIG. 1 a known (prior art) device for directing radiation to a layer 1 is shown. The layer is present on a substrate 2. The substrate is attached to a support 3. The device includes a first optical element L1 for focusing a first radiation beam B1 originating from a first radiation source S1 onto said layer, a second optical element L2 for focusing a second radiation beam B2 originating from a second radiation source S2 onto said layer. The first optical element L1 is additionally used for further focusing beam B2. The wavelengths of the radiation from said first and said second radiation source are different from each other. The first and second optical element are jointly movable with respect to said radiation sources S1 and S2. The focal points of the two radiation beams B1 and B2 at least substantially coincide with various movements of the first optical element L1 and the second optical element L2 with respect to the radiation sources.

In FIG. 2 a device according to the invention for directing radiation to a layer 1 is shown. The layer is present on a substrate 2. The substrate is attached to a support 3. The device includes a first optical element L1 for focusing a first radiation beam, a DUV laser beam B1, originating from a first radiation source S1 onto said layer 1, and a second optical element L2 for focusing a second radiation beam, a red laser beam B2, originating from a second radiation source S2 onto said layer. Again the first optical element L1 is additionally used for further focusing beam B2.

The layer 1 may be a layer present on a masterplate MA for the manufacture of optical discs or a layer on a wafer W for the manufacture of integrated circuits. The wavelength of the radiation from said first radiation source is a wavelength corresponding to DUV, e.g. 257 nm, and the wavelength of said second radiation source is a wavelength corresponding to red light e.g. 655 nm. The first and second optical elements L1 and L2 are jointly movable with respect to said radiation sources S1 and S2 and are mechanically interconnected. The focal points of the two radiation beams at least substantially coincide with various movements of the first optical element L1 and the second optical element L2 with respect to the radiation sources S1 and S2. The second optical element L2 has an aperture, a central hole A2, which allows optically undisturbed passage of the first radiation beam B1. The intensity of the second radiation beam at the position of the aperture A2 is substantially zero. A stop is positioned in the red beam B2 in order to prevent unwanted reflections and stray light. An annular beam of red focusing light is condensed in the objective L1 with the appropriate convergence. The first radiation beam B1 is aimed at the first optical element L1 as a substantially parallel radiation beam, whilst the second radiation beam B2 is aimed at the second optical element L2 as a substantially parallel radiation beam.

A plate M1, a mirror, is disposed between the second optical element L2 and the first radiation source S1. The mirror M1 has an aperture, a hole A1, through which the first radiation beam B1 passes optically undisturbed, whilst the second radiation beam B2 is reflected, outside the aperture A1, by the mirror M1 in the direction of the second optical element L2. The mirror M1 includes an angle of 45 degrees with the first radiation beam B1. Because no static dichroic mirror is required, lens L2 can be placed closer to L1 and therefore can be smaller, leading to a simpler and lighter construction for the actuated elements. Whether the second radiation beam B2, e.g. a red focus system, is used or not, the beam quality of the first radiation beam, DUV beam B1, is not degraded by additional optical elements. The annular shape of the second radiation beam B2 reduces the unfavorable interferences, which are most dominant in the region close to the optical axis.

The static mirror M1 is only used by the second radiation beam, e.g. red light beam B2, which reduces the demands for the coating and makes the mirror M1 thickness irrelevant.

In FIG. 3 a method of manufacturing an optical data storage medium 5 is shown. The method comprises the steps of exposing a master plate MA with an apparatus as shown in FIG. 2, making a stamper 4 on the basis of the master plate MA using the stamper 4 to manufacture the optical data storage medium 5. The making of a stamper 4 based on the master plate MA is a known process. The stamper 4 is e.g. a nickel stamper. The stamper 4 is used for manufacturing optical discs 5, e.g. CD's, DVD's, BD's and the like, by means of a known injection molding process. It is also possible, however, to use the master plate MA itself as a mold.

Alternatively a method of manufacturing an integrated circuit comprises the steps of a) on a wafer W, exposing the wafer with an apparatus as shown in FIG. 2, b) processing the wafer in order to remove parts of the layer and/or deposit a new layer, c) repeating steps a and b if required, d) cutting the wafer in order to isolate a usable integrated circuit.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A device for directing radiation to a layer (1) including:
a first optical element (L1) for focusing a first radiation beam (B1) originating from a first radiation source (S1) onto said layer,
a second optical element (L2) for focusing a second radiation beam (B2) originating from a second radiation source (S2) onto said layer, wherein the wavelengths of the radiation from said first and said second source are different from each other,
the first and second optical element being jointly movable with respect to said radiation sources, wherein the focal points of the two radiation beams at least substantially coincide with various movements of the first optical element and the second optical element with respect to the radiation sources, characterized in that the second optical element has an aperture (A2) for optically undisturbed passage of the first radiation beam (B1) and that the intensity of the second radiation beam (B2) at the position of the aperture (A2) is substantially zero.

2. The device according to claim 1, wherein the first radiation beam is aimed at the first optical element as a substantially parallel radiation beam, whilst the second radiation beam is aimed at the second optical element as a substantially parallel radiation beam.

3. The according to claim 1, wherein said first optical element and said second optical element are mechanically interconnected.

4. The device according to claim 1, wherein a plate (M1) is disposed between the second optical element (L2) and the first radiation source (S1), which plate has an aperture (A1) through when the first radiation beam (B1) passes optically undisturbed, whilst the second radiation beam is reflected, outside the aperture, by the additional plate (M1) in the direction of the second optical element (L2).

5. The device according to claim 4, characterized in that said plate includes an angle with the first radiation beam.

6. The device according to claim 1, characterized in that at least one of said radiation sources is a laser.

7. The device according to claim 6, characterized in that the wavelength of said laser is less than 400 nm.

8. An apparatus for exposing a master plate, which master plate is suitable for the manufacture of an optical data storage medium, the apparatus comprising:
a support (3) for said master plate (MA), said master plate including an optical layer thereon, and
a device comprising:
a first optical element (L1) for focusing a first radiation beam (B1) originating from a first radiation source (S1) onto said layer,
a second optical element (L2) for focusing a second radiation beam (B2) originating from a second radiation source (S2) onto said layer, wherein the wavelengths of the radiation from said first and said second radiation source are different from each other,
the first and second optical element being jointly movable with respect to said radiation sources, wherein the focal points of the two radiation beams at least substantially coincide with various movements of the first optical element and the second optical element with respect to the radiation sources, characterized in that the second optical element has an aperture (A2) for optically undisturbed passage of the first radiation beam (B1) and that the intensity of the second radiation beam (B2) at the position of the aperture (A2) is substantially zero.

9. An apparatus suitable for exposing a wafer, which wafer is suitable for the manufacture of an integrated circuit, the apparatus comprising:
a support (3) for said wafer (W), said wafer including an optical layer thereon, and
a device comprising:
a first optical element (L1) for focusing a first radiation beam (B1) originating from a first radiation source (S1) onto said layer,
a second optical element (L2) for focusing a second radiation beam (B2) originating from a second radiation source (S2) onto said layer, wherein the wavelengths of the radiation from said first and said second radiation source are different from each other,
the first and second optical element being jointly movable with respect to said radiation sources, wherein the focal points of the two radiation beams at least substantially coincide with various movements of the first optical element and the second optical element with respect to the radiation sources, characterized in that the second optical element has an aperture (A2) for optically undisturbed passage of the first radiation beam (B1) and that the intensity of the second radiation beam (B2) at the position of the aperture (A2) is substantially zero.

10. A method of manufacturing an optical data storage medium (5) comprising the steps of:
exposing a master plate (MA) with an apparatus as claimed in claim 8,
making a stamper (4) on the basis of the master plate (MA), using the stamper (4) to manufacture the optical data storage medium (5).

11. A method of manufacturing an integrated circuit comprising the steps of:
   a) on a wafer (W), exposing the wafer with an apparatus as claimed in claim 9,
   b) processing the wafer (W) in order to perform at least one of; remove parts of the layer (1) and deposit a new layer,
   c) repeating steps a and b if required,
   d) cutting the wafer (W) in order to isolate a usable integrated circuit.

* * * * *